US008552738B2

(12) United States Patent
Quinn

(10) Patent No.: US 8,552,738 B2
(45) Date of Patent: Oct. 8, 2013

(54) DEVICE FOR CHECKING A SAFETY CIRCUIT OF AN ELEVATOR

(75) Inventor: Daniel Quinn, Budd Lake, NJ (US)

(73) Assignee: Inventio AG, Hergiswil (CH)

( * ) Notice: Subject to any disclaimer, the term of this patent is extended or adjusted under 35 U.S.C. 154(b) by 571 days.

(21) Appl. No.: 12/626,090

(22) Filed: Nov. 25, 2009

(65) Prior Publication Data

US 2010/0141267 A1    Jun. 10, 2010

Related U.S. Application Data

(60) Provisional application No. 61/118,454, filed on Nov. 27, 2008.

(51) Int. Cl.
*G01R 31/02* (2006.01)
*B66B 1/34* (2006.01)

(52) U.S. Cl.
USPC .......................................... 324/549; 187/391

(58) Field of Classification Search
USPC .......................................... 324/549; 187/391
See application file for complete search history.

(56) References Cited

U.S. PATENT DOCUMENTS

| | | | | |
|---|---|---|---|---|
| 4,322,712 | A * | 3/1982 | Yoshida | 187/393 |
| 4,678,063 | A * | 7/1987 | Kitaoka et al. | 187/296 |
| 6,114,847 | A * | 9/2000 | Johnson | 324/127 |
| 6,385,547 | B1 * | 5/2002 | Bogli | 702/64 |
| 7,084,640 | B2 * | 8/2006 | Berhorst et al. | 324/611 |
| 2009/0321192 | A1 * | 12/2009 | Kattainen et al. | 187/279 |

FOREIGN PATENT DOCUMENTS

| | | | |
|---|---|---|---|
| EP | 1 090 870 | A1 | 4/2001 |
| WO | WO 2008/081074 | * | 1/2007 |

* cited by examiner

*Primary Examiner* — Jeff Natalini
(74) *Attorney, Agent, or Firm* — Fraser Clemens Martin & Miller LLC; William J. Clemens

(57) ABSTRACT

A testing device for checking a safety circuit of an elevator apparatus includes at least one hardware-monitoring unit for monitoring at least one functionally relevant composite resistor in the safety circuit.

11 Claims, 5 Drawing Sheets

DEVICE FOR CHECKING A SAFETY CIRCUIT OF AN ELEVATOR

CROSS-REFERENCE TO RELATED APPLICATION

This application claims the benefit of U.S. provisional patent application Ser. No. 61/118,454 filed Nov. 27, 2008.

FIELD OF THE INVENTION

This invention relates to elevator controls. More particularly, the invention is directed to checking the safety circuit of an elevator installation.

BACKGROUND OF THE INVENTION

From prior publication EP 1 090 870 A1 an elevator apparatus with a safety circuit is known wherein the safety circuit comprises a series-circuit of contacts, a safety relay, a voltage converter, and a monitor, the signal from the safety relay being communicated to an elevator control. A voltage that shall be regulated across the safety relay is applied to a network of the elevator apparatus that is connected to the voltage converter. The voltage converter, the series-circuit, and the network form a closed-loop control system that checks the voltage across the safety relay and holds it constant when all contacts of the series-circuit are closed. When doing so, the safety circuit acts independently of an output voltage of a voltage source that is subject to voltage fluctuations.

SUMMARY OF THE INVENTION

An objective of the invention is particularly to provide a device by means of which a reliable functioning of a hardware component, in particular of the safety circuit of an elevator, is realizable with little outlay. A testing device is proposed that serves the purpose of monitoring an elevator apparatus, or a component of an elevator, in particular a composite resistor of an elevator apparatus. This testing device comprises at least one hardware-monitoring unit which is provided for the purpose of monitoring at least one functionally relevant composite resistor. "Hardware" shall be particularly understood as at least one material component, for example a sensor. "Hardware-monitoring unit" is particularly to be understood as a unit that in at least one operating mode performs a checking and/or analysis of at least one characteristic of at least one component, and/or a sensing of at least one physical parameter, and/or, particularly preferably, has a processing unit, a memory unit, and contained in the memory unit an operating program for a monitoring. "Provided" shall be particularly understood as "specially equipped" and/or "designed" and/or "programmed". A "resistor" shall be understood to be a material element that presents to an electric current flowing through this element a resistance which is hereinafter referred to as "resistance-value". A "functionally relevant resistor" shall be particularly understood as a resistor element whose condition, particularly its resistance-value, is significant for at least one function of a device that contains the resistor. A "composite resistor" shall be particularly understood to be a resistor that results from connecting together at least two individual resistor elements. Such a composite resistor can, for example, consist of all the individual switching elements of a safety circuit of an elevator that form individual resistors. The individual resistors that are arranged in such a safety circuit are in particular formed by output-switching elements of sensors, which sensors detect states, in particular positions, of elevator components that are important for the safety of the elevator operation. Such output-switching elements of sensors are preferably present in the form of electronic or mechanical switches, in particular in the form of output-switching contacts. With "monitoring" by the hardware-monitoring unit of a resistor shall be particularly understood that the hardware-monitoring unit, in particular at various points in time, quantitatively and/or qualitatively evaluates at least one characteristic of the resistor. With an embodiment according to the invention, an apparatus for achieving reliable functioning of the safety circuit can be realized. In particular, a testing device with a unit for recognition of functionally hazardous changes in the condition of interacting hardware components, and in particular a series of electrically interconnected individual resistors, can be realized In particular, the detection of a functionally hazardous increase in on-state resistance-values of electric output-switching elements of sensors of a safety circuit of an elevator can be realized.

Preferably, the hardware-monitoring unit of the testing device comprises at least one sensing unit with at least one current-measuring unit and/or at least one voltage-measuring unit and/or at least one resistance-measuring unit. By this means, a constructively simple embodiment of the hardware-monitoring unit can be realized.

It is further proposed that the sensing unit be provided for the purpose of continuously, or at certain time intervals, sensing at least one resistor parameter that serves to detect functionally hazardous changes in condition of the resistor. Such a resistor parameter shall particularly be understood to be a physical parameter that can be used to calculate a resistance-value, or that gives the resistance-value of the resistor directly. Examples of such resistor parameters are an electric voltage that is applied to the resistor, and an electric current that is present in the resistor. In this manner, a reliable monitoring of the condition of the functionally relevant resistor can be realized.

Advantageously, the current-measuring unit is embodied as an induction current-measuring unit. In this manner, a contactless measuring of the current-magnitude in a conductor that carries the electric current can be realized. In particular, the introduction of a measurement resistance into this conductor, for example into the safety circuit of an elevator, can be avoided.

In a preferred variant embodiment of the invention, the hardware-monitoring unit, or the sensing unit that is present in the monitoring unit, has a comparison unit that is provided for the purpose of comparing a resistor parameter with at least one reference value. By this means, a simple quantitative monitoring can be realized.

Preferably, the hardware-monitoring unit or sensing unit contains at least one calibrating unit that is provided for the purpose of generating, preferably automatically, the reference value for the resistor parameter. In this manner, a simple commissioning of the testing device can be realized. In particular, a determination of the reference value by an installation technician can be avoided.

Advantageously, the hardware-monitoring unit or sensing unit has at least one output unit which is provided for the purpose of emitting at least one signal when an inadmissibly large change in the condition of the monitored hardware component, for example an inadmissibly large increase in a resistor parameter, or the resistance-value, of a functionally relevant composite resistor, is detected. In particular by this means, the functional safety of the device that contains the composite resistor, for example of an elevator that is monitored by a safety circuit, can be realized. In particular, a need for maintenance of the composite resistor, for example of a safety circuit, can be signaled and a preventive maintenance initiated. In particular, an operational incapability of the hardware components, for example of the functionally relevant resistor, can be prevented. In particular, the signal from the output unit can also be transmitted wirelessly, as for example by radio, and in particular also by SMS and/or e-mail.

Furthermore, an elevator apparatus is proposed that comprises at least one safety circuit that interacts with an elevator control and with at least one testing device. "Safety circuit" shall be particularly understood to mean at least two output-switching elements of sensors that are connected together in series, which sensors each sense an operating state of an apparatus of an elevator. The testing device has at least one hardware-monitoring device which in at least one operating mode monitors at least one functionally relevant condition of at least one hardware component of the safety circuit. A "functionally relevant" property of a hardware component shall be understood to be a characteristic of the hardware component that affects at least one function of a device that contains this hardware component. In particular, a "condition" of a hardware component shall be particularly understood to be a characteristic of the hardware component which the latter possesses, or obtains, as a result of the action upon it of environmental influences and/or chemical and/or physical processes. In particular, that the hardware-monitoring unit "monitors" a condition of a hardware component shall be understood to mean that, in particular at various points in time, the hardware-monitoring unit quantitatively and/or qualitatively checks at least one characteristic or feature of the condition of the hardware component. With an embodiment of the elevator apparatus according to the invention, the detection of functionally hazardous changes in the condition of interacting hardware components, in particular of interconnected resistors, can be realized. In particular, the elevator apparatus can signal the need for preventive maintenance of a safety circuit, so that, by means of preventive maintenance, a reliable functioning of a safety circuit, for example of the safety circuit of an elevator, can be assured.

Preferably, the hardware-monitoring unit that belongs to the testing device of the elevator apparatus contains at least one sensing device, which in the at-least one operating mode senses at least one resistor parameter that serves to determine the resistance-value of the safety circuit, or gives its resistance-value directly. By this means, a constructively simple monitoring of the condition of the safety circuit is realized.

Advantageously, the resistor parameter that is sensed by the sensing unit is the resistance-value of the entire safety circuit. In this manner, an inexpensive construction can be realized. In particular, an elaborate monitoring of individual resistors can be obviated.

Preferably, the sensing unit has at least one current-measuring unit and/or at least one voltage-measuring unit and/or at least one resistance-measuring unit. By this means, a constructively simple embodiment of the sensing unit can be realized.

It is further proposed that the current-measuring unit be embodied as an induction current-measuring unit. In this manner, a contactless measurement of the current-magnitude can be realized. In particular, an introduction of a measurement resistance into a conductor unit that carries the electric current can be avoided.

Advantageously, in the at-least one operating mode, the sensing unit continuously, or at certain time intervals, senses at least one resistor parameter. By this means, a reliable monitoring of the condition of the hardware components, for example of the output-switching elements of the sensors of the safety circuit, can be realized.

It is further proposed that the hardware-monitoring unit that belongs to the testing device of the elevator apparatus has at least one comparison unit, which, in the at-least one operating mode, compares the resistor parameter with at least one reference parameter. By this means, a simple quantitative monitoring of the condition of the hardware components, in particular of the output-switching elements of the sensors of the safety circuit, can be realized.

In a preferred variant embodiment, the hardware-monitoring device that belongs to the testing device of the elevator apparatus has at least one calibration unit, which in the at-least one operating mode generates the reference value. In this manner, a simple commissioning of the testing device can be realized. In particular, a determination of the reference value by an installation technician can be avoided.

During operation of the elevator, a safety-circuit voltage that is preferably taken from the elevator control is transmitted over the safety circuit and an interruption of this safety-circuit voltage, for example by an output-switching element of one of the sensors of the safety circuit, is detected by a control unit that belongs to the elevator apparatus. In such a case, this control unit causes the elevator control to stop operation of the elevator. It is therefore preferably integrated into the elevator control, or in its proximity, and can deliver a safety-circuit voltage that originates from the elevator control, or contain a voltage source of its own for the safety-circuit voltage. For at least a major part of the total operating time, the safety-circuit voltage energizes the safety circuit and causes in the safety circuit a current-flow when all output-switching elements of the sensors of the safety circuit are conductive.

In a possible embodiment of the invention, the current-flow that occurs when the safety circuit is uninterrupted is used for monitoring the condition of the hardware components, in particular for monitoring the resistance-value of the series-connected output-switching elements of sensors. Then, from the voltage across the conducting output-switching elements of the sensors, for example across a series of closed output-switching contacts, and from the current-magnitude that is sensed, at least the total resistance-value of the entire safety circuit is determined. With suitable sensing devices, additional characteristics of the transmitted voltage, and/or of the current-flow that arises, can be registered and evaluated.

In a particularly preferred embodiment of the invention, the hardware-monitoring unit that belongs to the testing device of the elevator apparatus has at least one separate monitoring-voltage source. From this separate monitoring-voltage source, for the purpose of monitoring the condition of the hardware components of the safety circuit, in particular for monitoring the total resistance-value of the output elements of sensors of the safety circuit that are connected in series, a measurement voltage is applied to the safety circuit. In normal elevator operation, the separate monitoring-voltage source of the safety circuit is decoupled from the safety circuit while the monitoring voltage described above that is taken from the elevator control energizes the safety circuit. To perform a measurement operation for monitoring the condition of the hardware components of the safety circuit, the separate monitoring-voltage source is preferably connected to the safety circuit at a point in time when all output elements of the sensors of the safety circuit are conductive. Such a measurement operation advantageously takes place during a stationary period of the elevator and lasts less than 10 seconds, preferably less than one second. During the measurement operation, the said monitoring voltage, which in normal operation is applied via the safety circuit, is decoupled from the safety circuit and preferably prevents any movement of the elevator by the elevator control.

In this manner, in the at-least one operating mode a separate monitoring-voltage source can be coupled to the safety circuit, which is more suitable for monitoring the condition of the hardware components than the voltage source that is connected to the safety circuit when the safety circuit is in operation. By this means, a usability of an adapted voltage, and in particular an improved quality of the evaluation of the measurement operation for monitoring the condition of the hardware components, can be realized.

Preferably, the hardware-monitoring unit has at least one output unit which, upon a detected change of the condition of the hardware components, in particular a change in the resistance-value of the series-connected output-switching elements of the sensors of the safety circuit, generates a signal. This signal serves to inform the elevator maintenance personnel of a need for maintenance of the safety circuit. By this means, a preventive maintenance of the safety circuit can be assured. In particular, the risk of an interruption in the operation of the elevator apparatus, and in particular of an elevator into which the elevator apparatus is built, can be reduced. The signal can also be transmitted wirelessly, as for example by radio, and in particular also by SMS and/or e-mail, to a maintenance operation.

It is further proposed that the elevator apparatus has at least one triggering unit that activates the hardware-monitoring unit. This triggering unit is preferably integrated into the hardware-monitoring unit that belongs to the testing unit of the elevator apparatus. Since the hardware-monitoring can only be performed when all output-switching elements contained in the safety circuit are conductive, the activation preferably takes place at a defined time of day at which usually only little elevator traffic occurs, or when the safety circuit has not been interrupted for a long period of time. By this means it can be realized that the short interruption of operation of the elevator that is necessary for the hardware-monitoring is not perceptible as a disturbance.

Preferably, at least one of the sensors is embodied as a mechanical limit switch, by means of which a pressure element actuates an electric output-switching contact. By this means, a simple construction of the sensor can be realized. The sensors can, however, also be embodied as, for example, inductive or capacitive switches, magnetic switches (reed switches), light sensors or light barriers, pressure switches, etc.

Further proposed is a monitoring method, in particular for monitoring at least part of an elevator apparatus. In this monitoring method, in at least one operating mode, at least one functionally relevant condition of at least one hardware component of a safety circuit is monitored. In particular, the said hardware component comprises at least two switching elements of sensors of the safety circuit that are connected in series. By means of the monitoring method, a particularly reliable functioning of the safety circuit, and therefore of the elevator, can be realized.

Furthermore, a hardware-monitoring method, in particular with a testing device, is proposed, in which a functionally relevant composite resistor is monitored by means of a continuous, or periodically occurring, measurement of the total resistance-value. Through initiation of a preventive maintenance upon sensing of an inadmissibly increased total resistance-value, a particularly reliable functioning of the safety circuit of an elevator, and hence of the elevator itself, can be realized.

Further advantages result from the following written description. Shown in the drawings are exemplary embodiments of the invention. The drawings, the description, and the claims contain numerous characteristics in combination. The specialist will expediently also view the characteristics individually, and combine them into advantageous further combinations.

DESCRIPTION OF THE DRAWINGS

The above, as well as other advantages of the present invention, will become readily apparent to those skilled in the art from the following detailed description of a preferred embodiment when considered in the light of the accompanying drawings in which.

DESCRIPTION OF THE PREFERRED EMBODIMENT

The U.S. provisional patent application Ser. No. 61/118,454, filed Nov. 27, 2008, is hereby incorporated herein by reference.

The following detailed description and appended drawings describe and illustrate various exemplary embodiments of the invention. The description and drawings serve to enable one skilled in the art to make and use the invention, and are not intended to limit the scope of the invention in any manner. In respect of the methods disclosed, the steps presented are exemplary in nature, and thus, the order of the steps is not necessary or critical.

Figure 1:
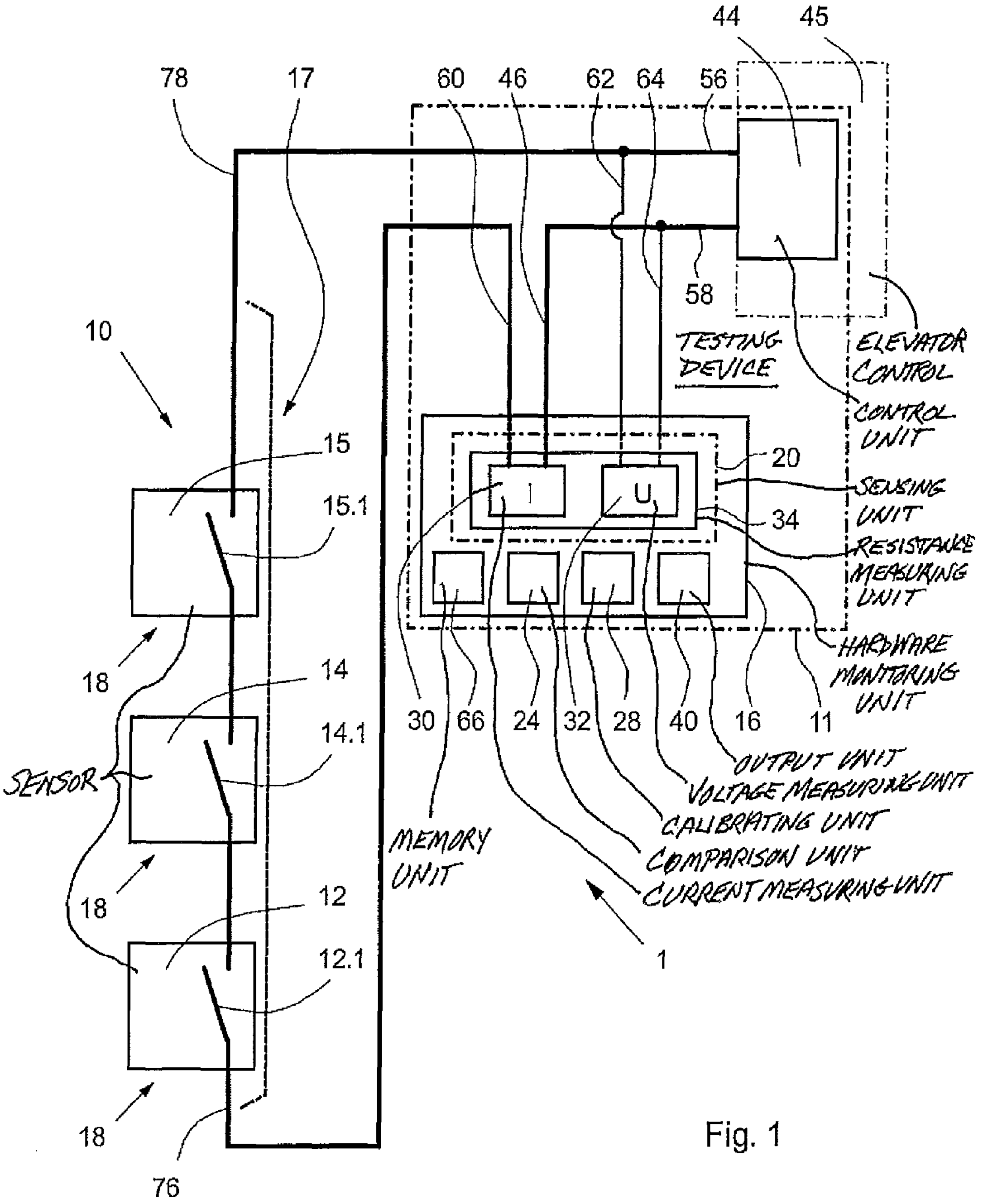
FIG. 1 a diagrammatic representation of an elevator apparatus according to the present invention.

FIG. 1 shows a diagrammatic representation of an elevator apparatus 1 according to the invention, which comprises a safety circuit 10 with three series-connected output-switching elements (output-switching contacts) 12.1, 14.1, 15.1 of sensors 12, 14, 15, and a testing device 11 with a control unit 44 and a hardware-monitoring unit 16. A sensing unit 20 of the hardware-monitoring unit 16 contains a resistance-measuring unit 34 which is composed of a current-measuring unit 30 and a voltage-measuring unit 32.

Figure 2:
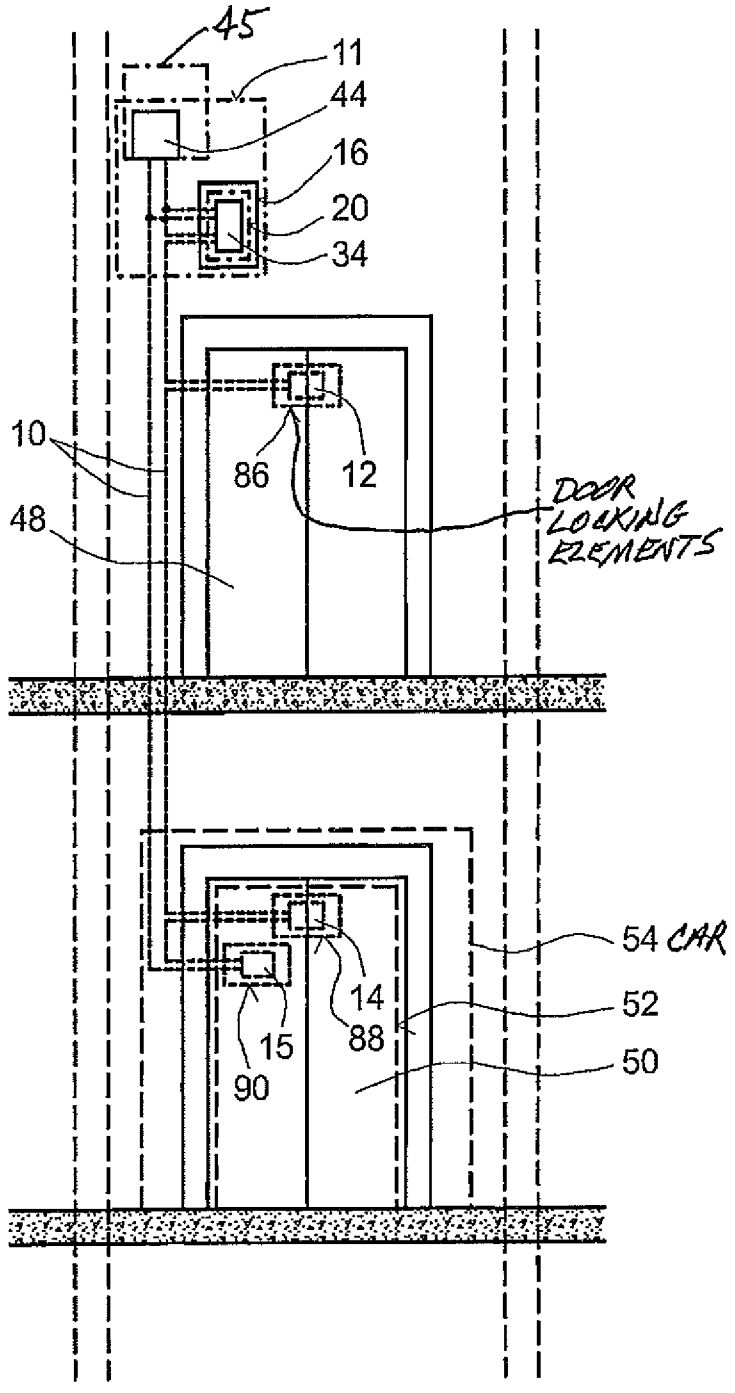
FIG. 2 is a schematic view of an elevator with the elevator apparatus according to FIG. 1.

In built-in state, the elevator apparatus 1 is a part of an elevator. FIG. 2 shows such an elevator with the elevator apparatus according to the present invention. The elevator has elevator-hoistway doors 48, 50 and a car door 52. Closable with the car door 52 is a car 54 of the elevator which is provided for the purpose of transporting goods and persons. The sensors 12, 14, are each assigned to one of the door-locking elements 86, 88, 90 of the elevator-hoistway doors 48, 50, or of the car door 52. If one of the elevator-hoistway doors 48, 50, or the car door 52, is closed and locked, the electrical output-switching contact 12.1, 14.1, 15.1 (not shown in FIG. 2) of the sensor 12, 14, 15 that is assigned to this door is closed. If one of the elevator-hoistway doors 48, 50, or the car door 52, is at least partly open and/or unlocked, the electrical output-switching contact 12.1, 14.1, 15.1 of the sensor 12, 14, 15 that is assigned to this door is open. Only in a state in which the output-switching contacts 12.1, 14.1, 15.1 of all sensors of the safety circuit 10 are closed and capable of functioning, and the safety circuit is thus conducting current, can an elevator control 45 recognize the state of the elevator as safe, and release operation of the elevator, i.e. a movement of the car 54 relative to the elevator-hoistway doors 48, 50. For the purpose of detecting whether this safe state is present, in normal operation of the elevator a voltage is present on the safety circuit of the elevator apparatus 1. This voltage causes a current-flow when the output-switching contacts 12.1, 14.1, 15.1 of all sensors 12, 14, 15 of the safety circuit 10 are closed. When the current-flow is detected by the control unit 44, this signals to the elevator control 45 that a movement of the car 54 is allowed. In this embodiment, the control unit 44 is integrated in the elevator control 45 that is represented by means of chain-dotted lines.

In at least one operating mode, the hardware-monitoring unit 16 monitors at least one functionally relevant condition of the hardware components 18 which are formed by the sensors 12, 14, 15. In principle, the safety circuit 10 conducts electric current when the output-switching elements of all sensors 12, 14, 15 of the safety circuit 10 are conductive, i.e. when the output-switching contacts 12.1, 14.1, 15.1 of the sensors 12, 14, 15 represented in FIGS. 1 and 2 are closed. So that in a safe state of the elevator, current can actually flow through the safety circuit 10, the output-switching elements and the output-switching contacts 12.1, 14.1, 15.1 of the sensors 12, 14, 15 must be capable of functioning. This means that in each sensor of the safety circuit, the electrical resistance-value of its output-switching element, or of its output-switching contact, must not exceed an admissible value when the sensor detects the safe state of the elevator component (e.g. a door-locking element) that is monitored by it. By this means it is ensured that the series-connected output-switching elements or output-switching contacts allow a current-flow through the safety circuit 10 that is unequivocally detectable by the control unit 44. For this purpose, the output-switching elements of the sensors 12, 14, 15 that are embodied as output-switching contacts 12.1, 14.1, 15.1 must, for example, be free of significant soiling, and free of significantly oxidized contact points, so that in the conductive state they do not form excessively high contact resistances in the safety circuit.

For the purpose of monitoring the functionally relevant contact resistances of the output-switching contacts 12.1, 14.1, 15.1 of the sensors 12, 14, 15, which together form a resistor 17, in the at-least one operating mode the sensing unit 20 senses a resistor parameter which can be, for example, the total resistance-value 22 of the safety circuit 10. The total resistance-value of the safety circuit 10 is that resistance-value which the series-connection of the output-switching contacts 12.1, 14.1, 15.1 of the sensors 12, 14, 15 of the safety circuit 10 has in total when all output-switching contacts of the sensors are in a closed state.

The current-measuring unit 30 has an output 46 which is connected to an input 58 of the control unit 44. Further, an input 60 of the current-measuring unit 30 is connected to an end 76 of the safety circuit 10, i.e. to the sensor 12. An output 56 of the control unit 44 is conductively connected to an end 78 of the safety circuit 10, i.e. to the sensor 15. Furthermore, an input 62 of the voltage-measuring unit 32 is conductively connected to the output 56. An output 64 of the voltage-measuring unit 32 is connected to the input 58 of the control unit 44. The voltage-measuring unit 32 measures a voltage that is present between the output 56 and the input 58 of the control unit 44 in the state in which the safety circuit 10 in principle conducts electric current. Furthermore, the current-measuring device 30 measures the current-magnitude of the electric current that flows through the safety circuit 20 when the safety circuit 10 is in the state in which it in principle conducts electric current, and, by means of the control unit 44, a voltage is applied to the input 58 and to the output 56. Should at least the output-switching contact 12.1, 14.1, 15.1 of one of the sensors 12, 14, 15 be too heavily soiled and/or oxidized, in this situation the safety circuit 10 carries only a current of reduced current-magnitude, or no current at all. From the measured current-magnitude and the measured voltage, the hardware-monitoring unit 16 determines the total resistance-value 22 of the safety circuit 10.

Figure 3:
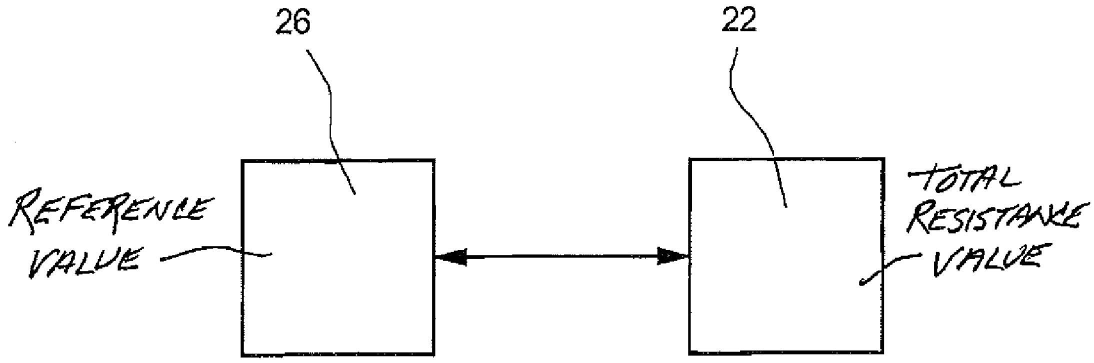
FIG. 3 a diagrammatic representation of a comparison of a resistor parameter with a reference parameter.

The hardware-monitoring unit 16 of the testing device 11 has a comparison unit 24 which in the at-least one operating mode compares the resistor parameters, in the present case the measured total resistance-value 22, with a reference value 26 (FIG. 3). The reference value 26 is identical to the total resistance-value that the safety circuit 10 has with unsoiled and unoxidized output-switching contacts 12.1, 14.1, 15.1 of the sensors 12, 14, 15 in particular immediately after a first commissioning of the elevator apparatus. In the at-least one operating mode, in particular immediately after the first commissioning of the elevator apparatus, the reference value 26 is measured by the hardware-monitoring unit 16, which contains a calibrating unit 28, and stored in a memory unit 66 of the comparison unit 24. After a sensing of the total resistance-value 22, which is performed after the measurement of the reference value 26, the comparison unit 24 compares the measured total resistance-value 22 of the safety circuit with the reference value 26 and signals to an output unit 40 that is integrated in the hardware-monitoring unit 16 a need for maintenance of the sensors 12, 14, 15 when the total resistance-value 22 deviates by more than a certain percentage value from the reference value 26. After a receipt of the need-for-maintenance signal, by means of a telephone or radio connection the output unit 40 notifies an elevator maintenance organization or a maintenance person. The maintenance person can then remove a possible soiling and/or oxidation and/or other impairment of the output-switching contacts of the sensors 12, 14, 15 before a further increase in the total resistance-value of the safety circuit 10 causes an interruption of the elevator operation.

Figure 4:
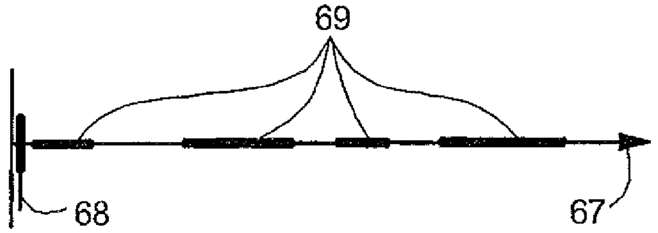
FIG. 4 a time-ray that represents an operating time of the elevator apparatus.

In the embodiment of the testing device according to FIG. 1, the sensing unit 20 senses the resistor parameter, and/or the total resistance-value 22, during all phases of the operating time in which all output-switching contacts of the sensors of the safety circuit are closed, i.e. in all phases in which the current-measuring unit detects a current-flow. FIG. 4 shows a time-ray which begins with a completion of the first commissioning of the elevator apparatus. Immediately after the first commissioning, the reference value 26 is measured at point-in-time 68. For example, during the aforesaid phases 69 of the operating time 67 after the point-in-time 68, the resistor parameter, or total resistance-value 22, is measured and compared with the reference value 26.

The hardware-monitoring unit 16 of the testing device 11 has a processing unit, a memory unit, and an operating program which is stored in the memory unit.

In principle, the safety circuit 10 has further electrical contacts which, for example, serve to monitor a brake of the elevator. The elevator apparatus 1 can also be retrofitted in an already existing elevator or in existing elevator systems.

Figure 5:
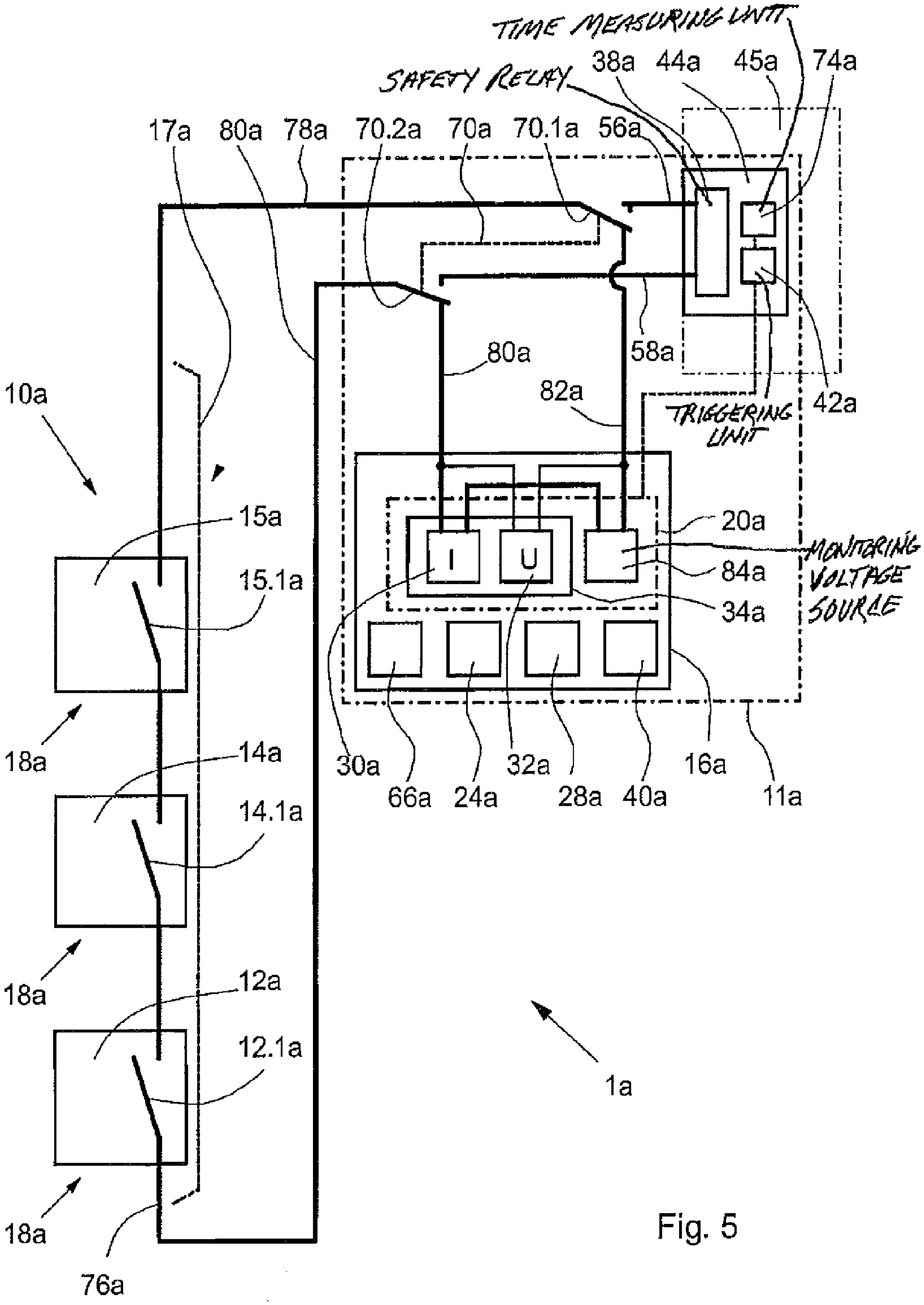
FIG. 5 a diagrammatic representation of an alternative exemplary embodiment of an elevator apparatus with a separate monitoring-voltage source according to the present invention.
Figure 6:
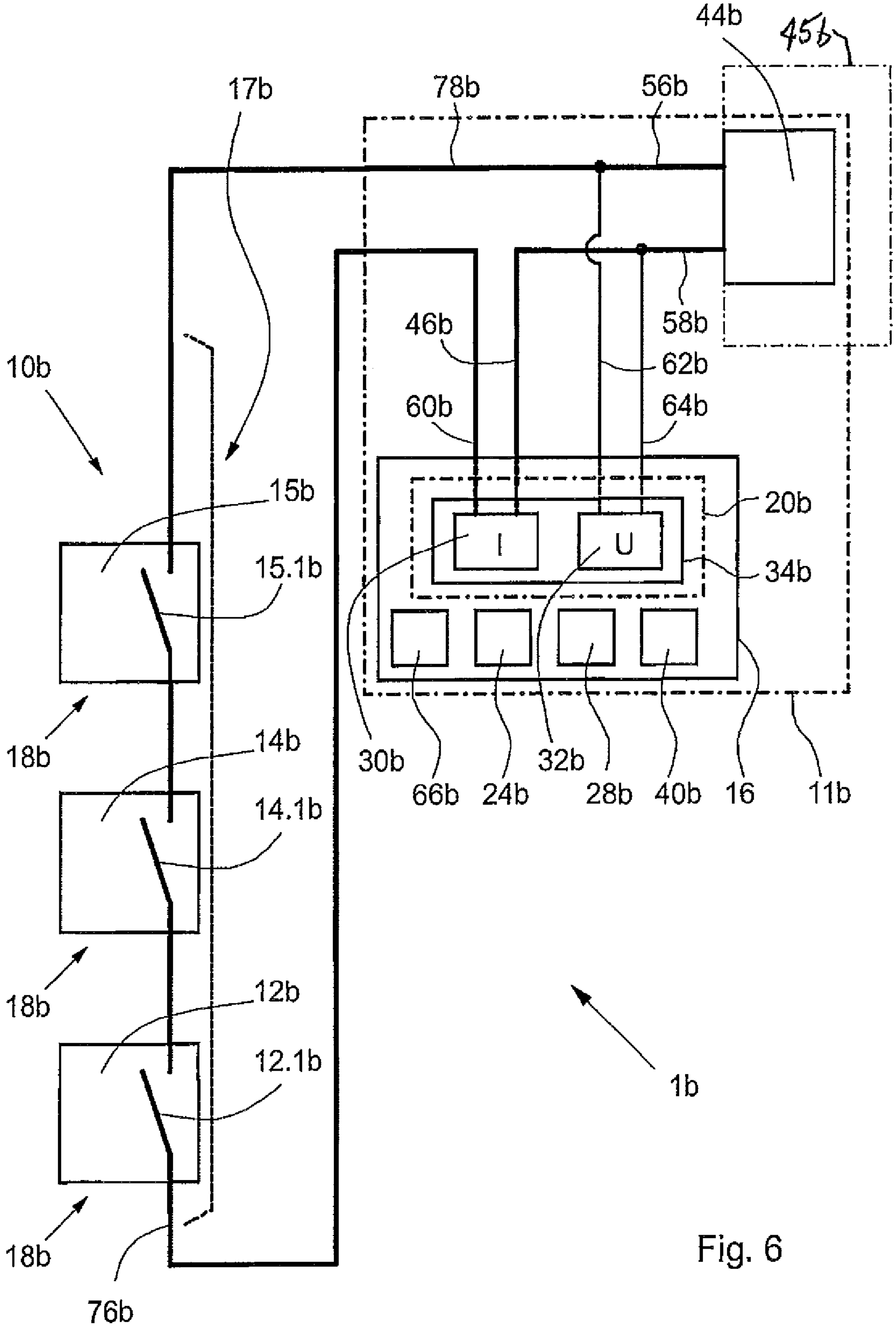
FIG. 6 a further diagrammatic representation of another alternative exemplary embodiment with an induction current-measuring unit according to the present invention.

Represented in FIGS. 5 and 6 are two alternative exemplary embodiments of an elevator apparatus. Components, characteristics, and functions that remain essentially the same are in principle indicated with the same reference numbers.

However, to differentiate the exemplary embodiments, in FIGS. 5 and 6 the reference numbers are suffixed with the letters "a" and "b" respectively. The following description is essentially limited to the differences relative to the exemplary embodiment in FIGS. 1 to 4, while for components, characteristics, and functions that remain the same, reference should be made to the description of the exemplary embodiment in FIGS. 1 to 4.

The elevator apparatus 1*a* that is represented in FIG. 5 comprises a testing device 11*a* with a control unit 44*a* and a safety circuit 10*a* wherein the control unit and the safety circuit preferably form a part of the elevator control 45*a* of an elevator. Furthermore, the testing device 11*a* comprises a hardware-monitoring unit 16*a* with a sensing unit 20*a* and a switching relay 70*a* with two switching contacts 70.1*a*, 70.2*a*. During operation of the elevator, via the control unit 44*a* of the elevator control 45*a* a safety-circuit voltage is applied to the safety circuit 10*a*. In a state in which the output-switching elements of the sensors 12*a*, 14*a*, 15*a* which are embodied as electronic contacts are closed, a current flows through the safety circuit 10*a* which, for example, activates a safety relay 38*a* of the control unit 44*a*, which signals to the elevator control 45*a* that a transportation of persons and/or goods by the elevator is possible without danger. The control unit 44*a* has a time-measuring unit 74 which measures a period of time during which the current flows uninterruptedly through the safety circuit 10*a*. Should this period of time exceed a certain value, a triggering unit 42*a* of the control unit 44*a* activates the hardware-monitoring unit 16*a* and the switching relay 70*a* with the switching contacts 70.1*a*, 70.2*a*. The switching contacts 70.1*a*, 70.2*a* thereupon decouple the safety circuit 10*a* from the control unit 44*a* and connect one end 76*a* of the safety circuit 10*a* with one input 80*a* of the hardware-monitoring unit 16*a*, and another end 78*a* of the safety circuit 10*a* with an output 82*a* of the hardware-monitoring unit 16*a*. By this means, a voltage that is generated by a monitoring-voltage source 84*a* in the hardware-monitoring unit 16*a* is applied to the safety circuit 10*a*. A current-measuring unit 30*a* and a voltage-measuring unit 32*a* of the sensing unit 20*a* form a resistance-measuring unit 34*a* which determines a total resistance-value of the safety circuit 10*a*. This takes place by means of the current-measuring unit 30*a* measuring the current-flow that is generated by the voltage source 84*a*, the resistance-measuring unit 34*a* measuring the monitoring voltage that is present on the safety circuit during the measuring operation, and the sensing unit determining from the measured current-magnitude and the measured monitoring-voltage the momentary total resistance-value of the safety circuit. As described above in connection with FIG. 1, the total resistance that is determined in a comparison unit 24*a* is compared with a saved reference value, whereupon if applicable the comparison unit of an output unit 40*a* signals an inadmissibly high total resistance-value. After the preferably less than 10-seconds-long sensing of the total resistance-value, the switching relay decouples the safety circuit 10*a* from the sensing unit 20*a* and applies again to the safety circuit the safety-circuit voltage that originates from the control unit 44*a* of the elevator control 45*a*. If the hardware-monitoring unit 16*a* is activated on account of the time period during which the safety circuit is not interrupted, a measurement of the total resistance-value takes place preferably at night, because in this time period a use of the elevator is rare. In principle, it is also conceivable that the control unit 44*a* recognizes in another manner that the elevator is not in use and thereupon causes a decoupling of the safety circuit 10*a* from the safety-circuit voltage and a coupling to the monitoring-voltage source of the hardware-monitoring unit 16*a*. It is further conceivable that the sensing of the total resistance-value 22 is limited to a fixed number of measurements per time unit, for example to one measurement per day at a time at which, according to experience, the elevator is hardly used.

FIG. 6 shows a further exemplary embodiment of an elevator apparatus 1*b* with a control unit 44*b*, a safety circuit 10*b*, and a hardware-monitoring unit 16*b* with a sensing unit 20*b*. The manner of functioning of the elevator apparatus 1*b* is essentially the same as the manner of functioning of the elevator apparatus described in connection with the elevator apparatus described with FIGS. 1 and 2. Here, the sensing unit 20*b* has a current-measuring unit 30*b* which is embodied as an induction current-measuring unit. When a current flows through the safety circuit 10*b*, a current is induced in the current-measuring unit 30*b*, by means of which the current-measuring unit 30*b* calculates the current-magnitude of the electric current that flows through the safety circuit 10*b*. Ends 76*b*, 78*b* of the safety circuit 10*b* are directly conductively connected with the control unit 44*b*.

In accordance with the provisions of the patent statutes, the present invention has been described in what is considered to represent its preferred embodiment. However, it should be noted that the invention can be practiced otherwise than as specifically illustrated and described without departing from its spirit or scope.

What is claimed is:

1. A testing device for the purpose of checking an elevator apparatus of an elevator, wherein the testing device comprises:

at least one hardware-monitoring unit for monitoring at least one functionally relevant composite resistance value in the elevator apparatus;

wherein said at least one hardware-monitoring unit contains at least one sensing unit which comprises at least one of a current-measuring unit, a voltage-measuring unit and a resistance-measuring unit; and wherein the testing device detects a functionally hazardous increase in on-state resistance-values of electric output-switching elements of sensors of a safety circuit of the elevator, said output-switching elements forming said composite resistance value, and wherein said at least one hardware-monitoring unit has at least one output unit for emitting at least one signal representing a need for maintenance in response to the detection of the functionally hazardous increase.

2. The testing device according to claim 1 wherein said at least one sensing unit senses at least one resistor parameter that serves to determine, at certain time intervals or continuously, functionally hazardous changes in properties of said composite resistance value.

3. The testing device according to claim 1 wherein said current-measuring unit is an induction current-measuring unit.

4. The testing unit according to claim 1 wherein said at least one hardware-monitoring unit includes at least one comparison unit for comparing a resistor parameter with at least one reference value.

5. The testing device according to claim 4 including at least one calibration unit for generating the at least one reference value.

6. An elevator apparatus with a testing device and at least one safety circuit having at least two sensors with output-switching elements the output-switching elements being series-connected and the testing device comprising:

at least one hardware-monitoring unit which in at least one operating mode monitors at least one functionally relevant condition of at least one hardware component of the safety circuit;

wherein said at least one hardware-monitoring unit contains at least one sensing unit which comprises at least one of a current-measuring unit, a voltage-measuring unit and a resistance-measuring unit; and wherein the testing device detects a functionally hazardous increase in on-state resistance-values of the series-connected output-switching elements of the sensors of the safety circuit of the elevator, and said at least one hardware-monitoring unit has at least one output unit for emitting at least one signal representing a need for maintenance in response to the detection of the functionally hazardous increase.

7. The elevator apparatus according to claim 6 wherein said hardware-monitoring unit has at least one sensing unit which in the at-least one operating mode senses at least one resistor parameter which represents a total resistance-value of the safety circuit.

8. The elevator apparatus according to claim 6 wherein said hardware-monitoring unit includes at least one monitoring-voltage source.

9. The elevator apparatus according to claim 6 including at least one triggering unit which, in at least one operating process, after a certain time-period of uninterrupted current-flow in the safety circuit, activates the hardware-monitoring unit.

10. The elevator apparatus according to claim 6 wherein at least one of the series-connected output-switching elements is an electrical output-switching contact.

11. A hardware-monitoring method using a testing device comprising the steps of:

a. providing a hardware-monitoring unit in the testing device;

b. monitoring a relevant composite resistance value of a safety circuit of an elevator control with the hardware-monitoring unit by detecting a functionally hazardous increase in on-state resistance-values of series-connected output-switching elements of the sensors of the safety circuit of the elevator, the output-switching elements forming the composite resistance value; and c. emitting from the hardware-monitoring unit at least one signal representing a need for maintenance in response to the detection of the functionally hazardous increase.

* * * * *